United States Patent
Janson (10) Patent No.: US 9,041,135 B2
(45) Date of Patent: May 26, 2015

(54) MONOLITHIC SUN SENSORS ASSEMBLIES THEREOF

(71) Applicant: The Aerospace Corporation, El Segundo, CA (US)

(72) Inventor: Siegfried W. Janson, Redondo Beach, CA (US)

(73) Assignee: The Aerospace Corporation, El Segundo, CA (US)

( * ) Notice: Subject to any disclaimer, the term of this patent is extended or adjusted under 35 U.S.C. 154(b) by 266 days.

(21) Appl. No.: 13/802,062

(22) Filed: Mar. 13, 2013

(65) Prior Publication Data

US 2014/0264700 A1    Sep. 18, 2014

(51) Int. Cl.
*H01L 27/146*    (2006.01)
*G01S 3/786*    (2006.01)
*H01L 31/0216*    (2014.01)
*H01L 31/02*    (2006.01)

(52) U.S. Cl.
CPC ......... *G01S 3/7861* (2013.01); *H01L 31/02164* (2013.01); *H01L 31/02024* (2013.01)

(58) Field of Classification Search
CPC ................................................. H01L 31/02024
USPC ............ 257/435, E31.096, E33.076, E33.077
See application file for complete search history.

(56) References Cited

U.S. PATENT DOCUMENTS

| | | | |
|---|---|---|---|
| 6,310,338 B1 * | 10/2001 | Blasing ...................... | 250/206.1 |
| 7,585,691 B2 | 9/2009 | Yano et al. | |
| 8,029,948 B2 * | 10/2011 | Hashimoto et al. ............... | 430/5 |
| 8,084,798 B2 | 12/2011 | Koike | |
| 8,101,971 B2 * | 1/2012 | Dutta ............................ | 257/184 |
| 8,110,883 B2 * | 2/2012 | Ward et al. .................... | 257/428 |
| 8,187,908 B2 | 5/2012 | Gaebler | |
| 8,304,859 B2 * | 11/2012 | Lee et al. ....................... | 257/616 |
| 8,358,419 B2 * | 1/2013 | Walters ......................... | 356/445 |
| 2003/0234341 A1 | 12/2003 | Osborn | |
| 2006/0055311 A1 * | 3/2006 | Jung et al. ...................... | 313/496 |
| 2006/0061708 A1 * | 3/2006 | Umebayashi et al. .......... | 349/95 |
| 2010/0304277 A1 * | 12/2010 | Oh ................................ | 430/5 |
| 2012/0194799 A1 * | 8/2012 | Kamiyama et al. .......... | 356/5.01 |
| 2013/0099211 A1 * | 4/2013 | Katz et al. ....................... | 257/40 |

* cited by examiner

*Primary Examiner* — Ida M Soward
(74) *Attorney, Agent, or Firm* — Jones Day; Jaime D. Choi (57) ABSTRACT

Under one aspect of the present invention, a monolithic sun sensor includes a photosensor; a spacer material disposed over the photosensor; and a patterned mask disposed over the spacer material and defining an aperture over the photosensor. The spacer material has a thickness selected such that the patterned mask casts a shadow onto the photosensor that varies as a function of the monolithic sun sensor's angle relative to the sun. The sun sensor may further include a substrate in which the photosensor is embedded or on which the photosensor is disposed. The spacer material may be transparent, and may include a layer of inorganic oxide, or a plurality of layers of inorganic oxide. The patterned mask may include a conductive material, such as a metal. The aperture may be lithographically defined, and may be square. The sun sensor may further include a transparent overlayer disposed over the patterned mask.

13 Claims, 7 Drawing Sheets

MONOLITHIC SUN SENSORS ASSEMBLIES THEREOF

FIELD OF THE INVENTION

This application relates to sun sensors.

BACKGROUND OF THE INVENTION

A variety of devices are known for determining the orientation, or attitude, of an object. Such devices may include gyroscopes, motion reference units, horizon sensors, orbital geocompasses, star trackers, and the like. One such category of devices, referred to as sun sensors, are intended to allow the object's angle relative to the sun to be determined based on shadows cast onto a photosensor. For spacecraft such as satellites and space vehicles, which may have relatively unobscured views of the sun during certain periods of the day, sun sensors may provide a convenient and relatively simple way of determining the spacecraft's angle relative to the sun, based on which the attitude of the spacecraft may be controlled.

Figure 1:
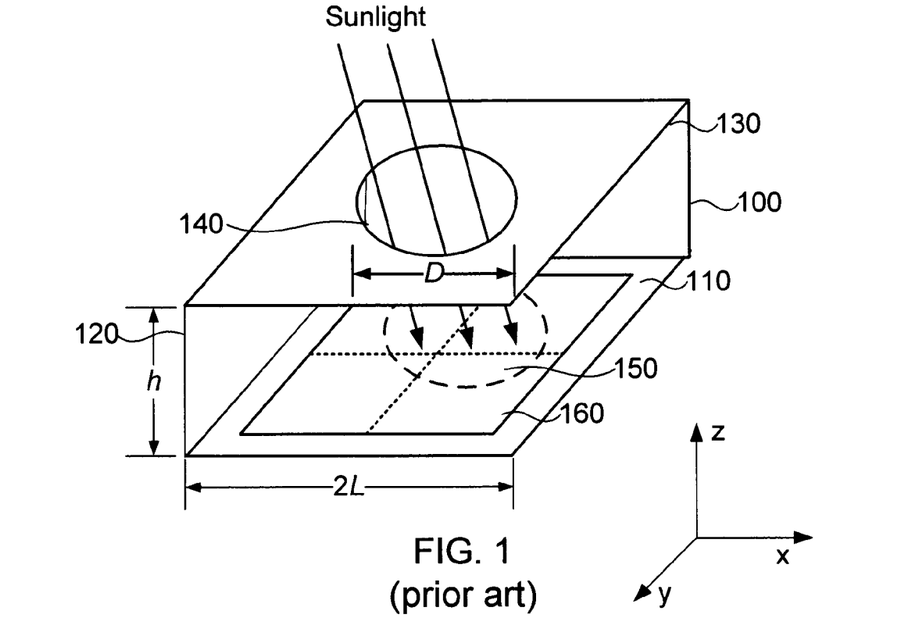
FIGS. 1-2 schematically illustrate perspective views of prior art sun sensors.

FIG. 1 schematically illustrates a perspective view of an exemplary previously known sun sensor 100. Sun sensor 100 includes photosensor 110, mechanical spacer 120, and aperture plate 130 having a round aperture 140 defined therein. Mechanical spacer 120 surrounds aperture plate 130 (only a portion of spacer 120 being illustrated), and supports and positions aperture plate 130 relative to photosensor 110. As the angle of sun sensor 100 varies relative to the sun, aperture plate 130 transmits sunlight 150 onto different regions of photosensor 110 (designated by the rounded, dashed line), and at the same time casts shadow 160 onto other regions of photosensor 110. Based on the relative proportion of sunlight 150 to shadow 160 on the different regions of photosensor 110, photosensor 110 generates one or more electrical signals that permit determination the angle of sun sensor 100 relative to the sun to be determined using known methods. Sun sensor 100 illustrated in FIG. 1 is a biaxial sun sensor because photosensor 110 includes four photodetectors (designated by the crossed, dotted lines) each respectively configured to receive an amount of sunlight 150 through aperture 140 and to generate a signal having a magnitude that is proportional to the amount of sunlight falling on the sensor. Based on the relative signals of the four photodetectors, the angle of sun sensor 100 relative to the sun may be determined in lateral dimensions x and y.

The sensitivity of sun sensor 100 to angle is a function of the relative dimensions of certain components of the sun sensor. Specifically, photosensor 110 may have a width 2L, where L is the width of each photodetector therein; mechanical spacer 120 may have a height h; and aperture 140 may have a diameter D. As the angle of sun sensor 100 changes relative to the sun, the rate at which the amount of sunlight 150 respectively falling on each of the photodetectors depends on the ratio between D and L. For example, the smaller the D/L ratio, the more quickly the amount of sunlight 150 changes as a function of angle on each of the photodetectors. The rate at which the amount of sunlight 150 respectively falling on each of the photodetectors also depends on the ratio between h and L. For example, the larger the D/L ratio, the more quickly the amount of sunlight 150 changes as a function of angle on each of the photodetectors. Those skilled in the art of sun sensors suitably may select appropriate absolute and relative values of D, h, and L for a given application.

Figure 2:
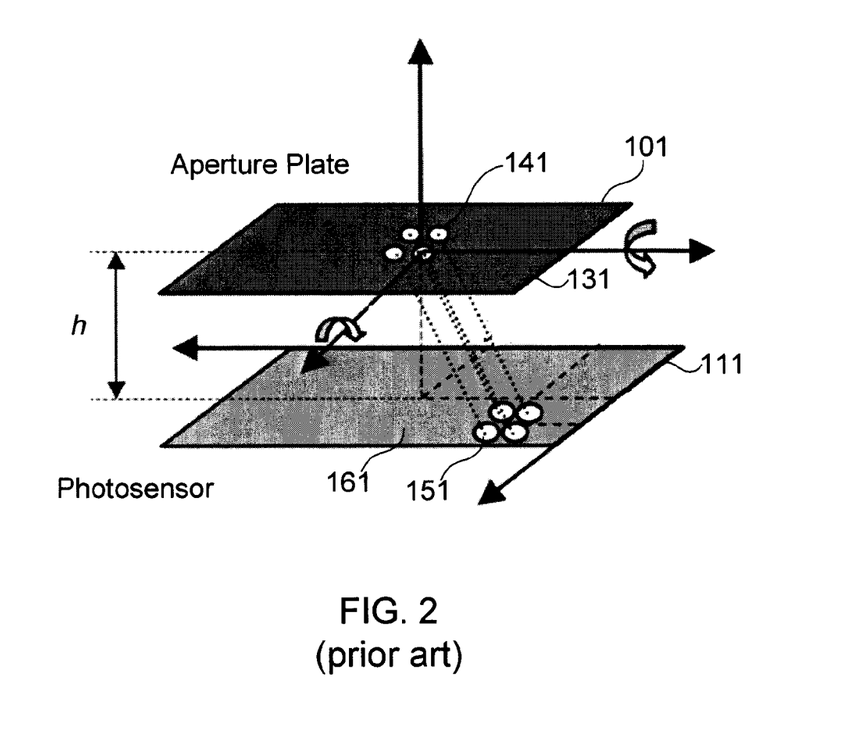

In alternative previously known sun sensor 101 illustrated in FIG. 2, alternative aperture plate 131 includes a plurality of apertures 141 through which a plurality of sunlight regions 151 fall on respective regions of photosensor 111, with shadow 161 cast upon other regions of photosensor 111. Photosensor 111 may be a CMOS (complementary metal-oxide-semiconductor) imager that includes a relatively large number of photodetectors (pixels), e.g., greater than 100,000 or greater than 1 million photodetectors. An image of the sunlight and shadow cast onto photosensor 111 through apertures 141 is obtained, and the centroid of each illuminated region is calculated based on pixel coordinates. The centroids are digitally averaged together, applying geometric distortion factors determined by calibration, to generate two orthogonal solar incidence angles. Megabytes of storage memory and a 16-bit or larger microprocessor are typically required to process the image data. As for sun sensor 100, the sensitivity of alternative sun sensor 101 is a function of the relative dimensions of certain components of the sun sensor, such as the size of photosensor 111, the size of apertures 141, and the height h of the mechanical spacer disposed between aperture plate 131 and photosensor 111 (not illustrated in FIG. 2).

The various components of sun sensor 100 illustrated in FIG. 1 and alternative sun sensor 101 illustrated in FIG. 2 may be mechanically arranged relative to one another. For example, sun sensor 100 may be constructed by positioning and affixing mechanical spacer 120 around photosensor 110, and by positioning and affixing aperture plate 130 onto mechanical spacer 120 in such a manner that aperture 140 is positioned over photosensor 110. Such a mechanical coupling of components for each individual sun sensor may be time-consuming, and practical considerations may require that the components have a size sufficiently large to permit their mechanical handling. For example, sun sensors 100, 101 may have dimensions of 1 to 6 centimeters on a side. The amount of power required to operate the sun sensor, e.g., to apply a suitable bias to photosensor 110, may also scale with the physical size of the sun sensor. Accordingly, larger sun sensors may require larger power supplies, thus further increasing the mass of the sun sensor.

Furthermore, such mechanically coupled components may be susceptible to alignment errors. Although each individual sun sensor may be calibrated to reduce such errors, such individual calibration may be relatively time-consuming. Because of the comparative complexity of manufacturing, assembling, and calibrating such previously known sun sensors, the costs of such sun sensors may be on the order of thousands of dollars or more.

Thus, what is needed is a sun sensor with improved ease of manufacture, reduced cost of manufacture, reduced size, reduced power consumption, reduced susceptibility to alignment error, and reduced need for individual calibration.

SUMMARY OF THE INVENTION

Embodiments of the present invention provide monolithic sun sensors, assemblies thereof, and methods of making and using same. The monolithic sun sensors may provide improved ease of manufacture, reduced cost of manufacture, reduced size, reduced power consumption, reduced susceptibility to alignment error, and reduced need for individual calibration as compared to previously known sun sensors.

Under one aspect of the present invention, a monolithic sun sensor includes a photosensor; a spacer material disposed over the photosensor; and a patterned mask disposed over the spacer material and defining an aperture over the photosensor. The spacer material has a thickness selected such that the patterned mask casts a shadow onto the photosensor that varies as a function of the monolithic sun sensor's angle relative to the sun. The sun sensor may further include a substrate in which the photosensor is embedded or on which the photosensor is disposed. The spacer material may be transparent, and may include a layer of inorganic oxide, or a plurality of layers of inorganic oxide. The patterned mask may include a conductive material, such as a metal. The aperture may be lithographically defined, and in one embodiment may be square. The sun sensor may further include a transparent overlayer disposed over the patterned mask. Analog and digital signal conditioning electronics may be disposed on the substrate.

Under another aspect of the present invention, an assembly of monolithic sun sensors may include a substrate; a plurality of photosensors disposed on or embedded in the substrate; a spacer material disposed over the plurality of photosensors; and a patterned mask disposed over the spacer material. The patterned mask may define a plurality of apertures respectively over the plurality of photosensors. The spacer material may have a thickness selected such that the patterned mask casts a shadow onto the plurality of photosensors that varies as a function of the assembly's angle relative to the sun.

Under another aspect of the present invention, a method of using such an assembly of monolithic sun sensors may include dicing the substrate so as to form a plurality of discrete monolithic sun sensors; and measuring the angle of the plurality of monolithic sun sensors relative to the sun without individually calibrating the sun sensors of the plurality.

Under yet another aspect of the present invention, a method of making a monolithic sun sensor may include providing a photosensor; disposing a spacer material over the photosensor; and disposing a patterned mask over the spacer material so as to define an aperture over the photosensor. The spacer material may have a thickness selected such that the patterned mask casts a shadow onto the photosensor that varies as a function of the monolithic sun sensor's angle relative to the sun. The spacer material may be disposed over the photosensor using chemical vapor deposition, physical vapor deposition, or liquid deposition. The patterned mask may be disposed over the photosensor using chemical vapor deposition, physical vapor deposition, or liquid deposition. The aperture may be formed using photolithography or particle beam lithography.

Under yet another aspect of the present invention, a method of making an assembly of monolithic sun sensors includes providing a substrate having a plurality of photosensors disposed thereon or embedded therein; disposing a spacer material over the plurality of photosensors; and disposing a patterned mask disposed over the spacer material. The patterned mask may define a plurality of apertures respectively over the plurality of photosensors. The spacer material may have a thickness selected such that the patterned mask casts a shadow onto the plurality of photosensors that varies as a function of the assembly's angle relative to the sun. The method may further include dicing the substrate so as to form a plurality of discrete monolithic sun sensors.

DETAILED DESCRIPTION

Embodiments of the present invention provide monolithic sun sensors, assemblies thereof, and methods of making and using same. By "monolithic sun sensor" it is meant a sun sensor in which all components are integrated into a unitary whole, rather than first being individually manufactured and subsequently mechanically coupled together. For example, the monolithic sun sensors provided herein may include a photosensor, a spacer material disposed over the photosensor, and a patterned mask that is disposed over the spacer material and defines an aperture over the photosensor. The thickness of the spacer material may define the distance between the photosensor and the patterned mask, in a manner analogous to that of mechanical spacer 120 described further above with reference to FIG. 1. However, rather than being separately produced and subsequently coupled to (and around) the photosensor, the spacer material provided herein instead may be deposited over the photosensor, thus obviating the need for an additional assembly step or for the spacer to be sufficiently large to mechanically manipulate. The spacer material may be deposited using any suitable process, such as chemical vapor deposition, physical vapor deposition, or liquid deposition, to any suitable thickness. The patterned mask of the present sun sensors defines an aperture, and casts a shadow onto the photosensor that varies as a function of angle relative to the sun, in a manner analogous to that of aperture plate 130 described further above with reference to FIG. 1. However, rather than being separately produced and subsequently coupled to a mechanical spacer, the patterned mask provided herein instead may be deposited and patterned over the spacer material, thus obviating the need for an additional assembly step or for the patterned mask to be sufficiently large to mechanically manipulate. Moreover, the position of the aperture in the mask may be aligned relative to the photosensor with relatively high accuracy using known photolithographic or lithographic techniques, thus reducing the sun sensor's susceptibility to alignment error and reducing or obviating the need to individually calibrate the sun sensors thus formed. Additionally, the methods provided herein are particularly well suited to defining apertures that are rectangular or square, rather than rounded as illustrated in FIGS. 1-2. As described in greater detail below, the use of rectangular or square apertures may simplify the manner in which a sun sensor's angle may be determined based on the output of a photosensor therein.

In some embodiments, the monolithic sun sensors provided herein are formed using batch processing. That is, a plurality of sun sensors instead may be formed using a common sequence of processing steps, rather than providing each sun sensor individually through such a sequence of steps. For example, an assembly of sun sensors may be prepared by disposing a plurality of photosensors on a substrate, or embedding a plurality of photosensors within a substrate. The spacer material then may be disposed over the plurality of photosensors, and the patterned mask then may be disposed over the spacer material so as to define apertures over the photosensors. The substrate then may be diced so as to separate the plurality of sun sensors from one another, e.g., either into individual sun sensors, or into groups of sun sensors that share a common portion of the substrate. Because the sun sensors of the plurality are formed by a common process, they may be expected to have similar responses as one another, thus obviating the need to individually calibrate the sensors. Additionally, because known materials processing techniques such as suitable for use in forming monolithic sun sensors by batch processing may be expected to have highly reproducible results, it may be expected that sun sensors formed in different batches than one another may have similar responses as one another, thus obviating the need to individually calibrate the sensors. Indeed, because of the efficiencies in time, materials, and energy gained from such batch processing, it is believed that the present sun sensors may be prepared for per-sensor costs of less than about $10 each, or even less than about $1 each, or on the order of about $0.10 each, thus opening the door for such sun sensors to be used in terrestrial applications for which previously known sun sensors may be prohibitively expensive. As used herein, the term "about" means within 10% above or below the stated value.

One exemplary set of materials processing techniques that may be suitable for preparing monolithic sun sensors is CMOS (complementary metal-oxide-semiconductor) processing, which may include the use of suitable material deposition and patterning techniques known in the art. Known gas-phase techniques for depositing materials on a substrate include physical vapor deposition (PVD) based techniques such as evaporation, sputtering, molecular beam epitaxy (MBE), and pulsed laser deposition (PLD); as well as chemical vapor deposition (CVD) based techniques such as atomic layer deposition (ALD). Both PVD and CVD based techniques may include exposing the substrate to an atomic or molecular species at a set of processing parameters that are selected based on the deposition technique to be used, the material to be deposited, and the substrate upon which the material is to be deposited. Liquid-based deposition techniques are also known and suitable for use in preparing the present sun sensors. Material patterning techniques known in the art that are suitable for use in preparing the present sun sensors include photolithography or particle beam (ion beam) lithography.

Note that by suitably adjusting the materials and dimensions of the various components of the monolithic sun sensors provided herein, the resulting sun sensors may be prepared at any suitable scale for use in devices of a desired size. For example, as noted above, sun sensors may provide a convenient and relatively simple way of determining the angle of a spacecraft relative to the sun, based on which the attitude of the spacecraft may be controlled. The present sun sensors may be particularly suitable for use in spacecraft that are "ultra-small," e.g., having dimensions of about 10 centimeters or less on a side, or even "atto-spacecraft," e.g., having dimensions of about 2 centimeters or less on a side or a mass of about 10 grams or less, although it should be apparent that the sun sensors may be used in any appropriately sized spacecraft, such as microsatellites, nanosatellites, picosatellites, femtosatellites, and attosatellites, including "CubeSats," which are cube-shaped satellites with a volume of 1 liter (e.g., have dimensions of 10 centimeters on each side) and a mass of no more than 1.33 kg, as well as larger spacecraft such as a space shuttle or a space station, so as to determine the orientation of the spacecraft or a component thereof. For example, the sun sensors may be provided on an articulated solar array or solar sail on the spacecraft and their output used to adjust the attitude of the solar array or solar sail as the spacecraft moves relative to the sun.

The present sun sensors also may be suitable for use in terrestrial applications. For example, the sun sensors may be provided on vehicles such as unmanned aerial vehicles (UAVs), e.g., to determine the orientation of the UAV relative to the sun. Or, for example, the sun sensors may be provided on electronic devices that include displays, such as cellular telephones, smartphones, laptop computers, cameras, watches, automobile dashboards, and the like, and their output used to control the contrast and brightness of the displays. Or, for example, the sun sensors may be provided on optical devices such as active sunglasses, and their output used to cause the optical device to darken only when the sun shines into the optic at a specified angle, e.g., to shield the sunglass wearer's eyes from direct or near-direct sunlight. Or, for example, the sun sensors may be provided in articulated solar arrays, e.g., disposed on photovoltaic cells, mirrors, heliostats, lenses, or troughs used to generate electricity, and the sensor output used to control the attitude of the cells, mirrors, or lenses as the sun moves throughout the day. Or, for example, the sun sensors may be provided in building heating and ventilation systems and their output used to provide thermal control based on solar loading, which may vary throughout the day. Or, for example, the sun sensors may be provided in automatic window shade controls, and their output used to adjust the amount of light transmitted by the window shade as the sun moves throughout the day. Or, for example, the sun sensors may be provided in automobiles or other vehicles as a sun-blind monitor to provide local situational awareness and electronic brake control. Additionally, because the present sun sensors may suitably be prepared at reduced size, they also may have reduced power requirements, thus permitting the use of smaller power sources and thus further reducing the mass of the sun sensors.

First, monolithic sun sensors constructed in accordance with the principles herein will be described, as well as assemblies thereof. Then, exemplary methods of making and using such sun sensors or assemblies thereof will be described. Lastly, some illustrative embodiments of sun sensors that suitably may be formed using CMOS processing will be described.

Figure 3A:
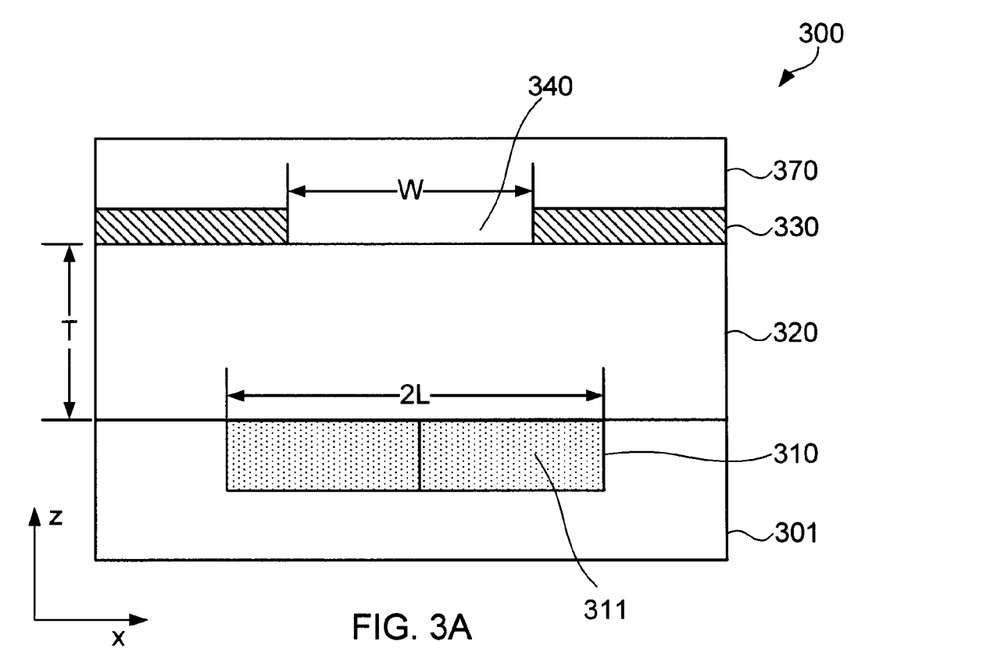
FIG. 3A schematically illustrates a cross-sectional view of a monolithic sun sensor, according to one embodiment of the present invention.

FIG. 3A illustrates sun sensor 300 according to one embodiment of the present invention. Sun sensor 300 includes substrate 301, photosensor 310, spacer material 320, patterned mask 330 having rectangular or square aperture 340 defined therein, and transparent overlayer 370. In the illustrated embodiment, photosensor 310 has dimension 2L, where L is the dimension of photodetectors 311 therein, and is embedded within substrate 301, although it should be appreciated that photosensor 310 alternatively may be disposed on substrate 301, or even may be free-standing. That is, substrate 301 may be considered optional. Spacer material 320 is disposed over photosensor 310, and patterned mask 330 is disposed over spacer material 320 such that square aperture 340 having width W is positioned over photosensor 310. The thickness T of spacer material 320 in the region between photosensor 310 and patterned mask 330 defines the physical distance between photosensor 310 and patterned mask 330 in a manner analogous to height h of mechanical spacer 120 described further above with reference to FIG. 1. However, the refractive index of spacer material 320 may cause the effective distance between spacer material 320 and patterned mask 330 to differ from what it would be in free space. Moreover, spacer material 320 and patterned mask 330 may be disposed on photosensor 310 using materials processing techniques, rather than mechanically assembled. Accordingly, the thickness T of spacer material 320, width W of aperture 340, and dimension 2L of photosensor 310 suitably may be co-selected so as to provide sun sensor 300 with desired performance characteristics, without regard to practical constraints that otherwise may arise from mechanical assembly of such components, as was previously known. In some embodiments, the ratio of T:W may be in the range of about 1:10 to 10:1, e.g., about 2:9 to 9:2, e.g., about 3:7 to 7:3, e.g., about 2:3 to 3:2, or about 1:1. In some embodiments, the ratio of W:2L may be greater than 1:10, e.g., greater than 1:9, e.g., greater than 1:8, e.g., greater than 1:7, e.g., greater than 1:6, e.g., greater than 1:5, e.g., greater than 1:4, e.g., greater than 1:3, e.g., greater than 1:2, e.g., greater than 1:1.5, e.g., 1:1. In one preferred embodiment, W=L.

Substrate 301 illustrated in FIG. 3A may include any suitable electrically conductive, electrically semiconductive, or electrically insulative material or combination of materials. Examples of conductive materials suitable for use in substrate 301 may include, for example, metals such as copper and aluminum, polycrystalline silicon (poly-Si), conductive polymers, and transparent conductors such as tin oxide ($SnO_2$), indium tin oxide (ITO), zinc oxide (ZnO), and the like. Examples of semiconductive materials suitable for use in substrate 301 may include, for example, monocrystalline or amorphous silicon, germanium, gallium arsenide (GaAs), gallium phosphide (GaP), indium gallium arsenide (InGaAs), lead sulfide (PbS), silicon carbide (SiC), indium phosphide (InP), and the like. Examples of insulative materials suitable for use in substrate 301 may include, for example, inorganic oxides such as silicon oxide ($SiO_x$, e.g., $SiO_2$) or aluminum oxide ($Al_2O_3$), silicon nitride ($Si_3N_4$), and insulative polymers. In one nonlimiting example, substrate 301 includes high-purity, monocrystalline silicon, which may include regions doped with suitable dopants such as boron, arsenic, phosphorous, or gallium so as to define p-n junctions that may be used as components of one or more photodiodes for use in photosensor 310.

Figure 3B:
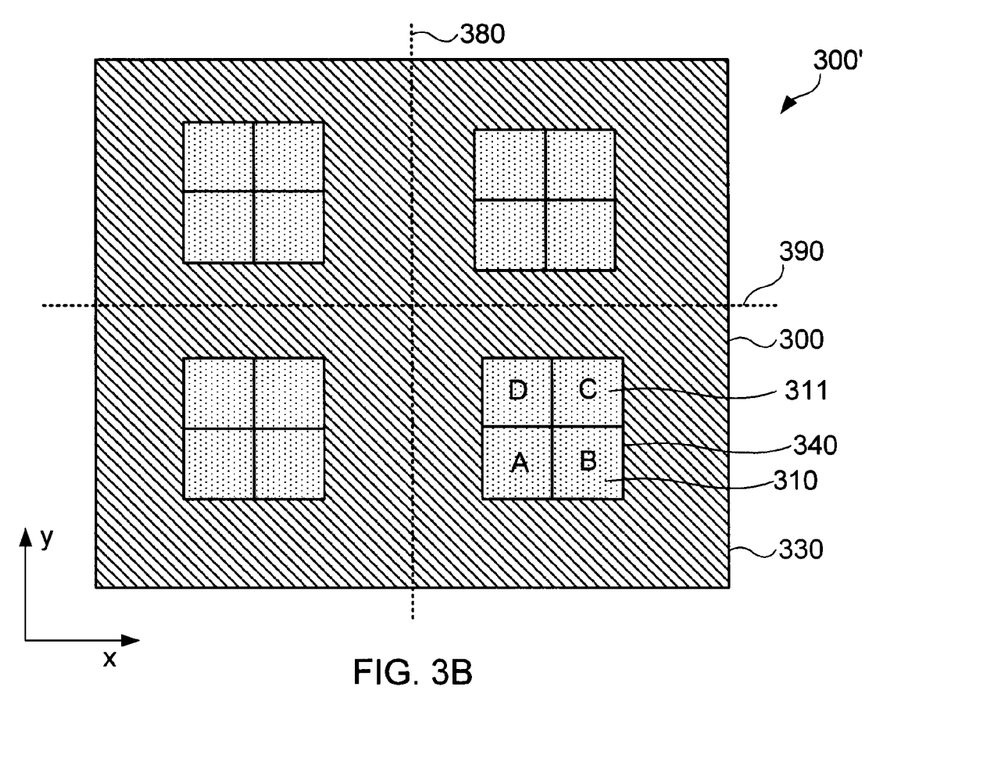
FIG. 3B schematically illustrates a plan view of an assembly of monolithic sun sensors, according to one embodiment of the present invention.

Photosensor 310 illustrated in FIG. 3A may be disposed on or embedded in substrate 301, and is configured to provide one or more output signals based on the amount of sunlight that falls on different regions thereof. For example, photosensor 310 may have a biaxial construction analogous to that of photosensor 110 illustrated in FIG. 1, e.g., may include four photodetectors 311, each of dimension L, and each of which is configured to output a signal. In FIG. 3A, the vertical line bisecting photosensor 310 is intended to represent a division between two of such photodetectors 311, the other two photodetectors not being visible in the illustrated cross-section but are illustrated in FIG. 3B described further below. Based on the relative signals of the four photodetectors 311, the angle of sun sensor 300 relative to the sun may be determined in lateral dimensions x and y. An exemplary embodiment of a biaxial sun sensor is described further below with reference to FIGS. 6A-6B. Or, for example, photosensor 310 may have a uniaxial construction that includes two photodetectors, each of dimension L, each of which is configured to output a signal. Based on the relative signals of the two photodetectors, the angle of sun sensor relative to the sun may be determined either in the x or y direction; a pair of such sun sensors may be provided to achieve measurements in both the x and y directions, such as described further below with reference to FIGS. 7A-7B.

Suitable photosensors and photodetectors for use in sun sensors may include, for example, photodiodes, active pixel sensors (APSs), charge-coupled devices (CCDs), reverse-biased light emitting devices (LEDs), light dependent resistors (LDRs), photovoltaic (PV) cells, phototransistors, and the like. In one exemplary biaxial embodiment, photosensor 310 includes four photodetectors 311 provided by four photodiodes embedded in substrate 301, while in one exemplary uniaxial embodiment, photosensor 310 includes two photodetectors 311 provided by two photodiodes embedded in substrate 301. As noted above, one or more regions of substrate 301 may be doped so as to define a p-n junction that may be used as components of photosensor 310. As described in greater detail below with reference to FIGS. 6A-7B, other components of photosensor 310 may be disposed over substrate 301.

Spacer material 320 may be disposed over the entirety of photosensor 310, as well as over portions of substrate 301, as illustrated in FIG. 3A. In an alternative embodiment (not illustrated), substrate 301 may be omitted, and spacer material 320 may be disposed solely on photosensor 310. Preferably, spacer material 320 is at least partially transparent such that at least some sunlight that passes through aperture 340 falls on photosensor 310 with sufficient intensity that the angle of sun sensor 300 may be determined accurately. Spacer material 320 may include a plurality of layers, which may have the same or different compositions as one another. Spacer material 320 may include any suitable electrically conductive, electrically semiconductive, or electrically insulative material or combination of materials that is at least partially transparent to sunlight. It should be appreciated that some materials may be transparent to certain wavelengths of the sunlight, but opaque to other wavelengths of the sunlight. Preferably, spacer material 320 is at least partially transparent to wavelengths of sunlight that generate suitable signals at photosensor 310 for use in determining the angle of sun sensor 300. In one illustrative embodiment, overlayer 370 is transparent in the range of about 400 nm to about 1100 nm. In one illustrative embodiment, spacer material 320 includes one or more dielectric materials.

Examples of transparent conductive materials suitable for use in spacer material 320 may include, for example, conductive polymers and transparent conductors such as tin oxide ($SnO_2$), indium tin oxide (ITO), zinc oxide (ZnO), and the like. Examples of transparent insulative materials suitable for use in spacer material 320 may include, for example, inorganic oxides such as silicon oxide ($SiO_x$, e.g., $SiO_2$) or aluminum oxide ($Al_2O_3$), silicon nitride ($Si_3N_4$), and insulative polymers. Additionally, non-transparent materials may be disposed above, below, or within spacer material 320, but preferably are not disposed in regions that lie over photosensor 310 so as to reduce the risk that such non-transparent materials may cast a shadow onto photosensor 310 when sun sensor 300 is exposed to sunlight.

Patterned mask 330 is disposed over spacer material 320 and includes aperture 340 defined therein that preferably is positioned directly over photosensor 310, as illustrated in FIG. 3A. Patterned mask 330 preferably is opaque and of sufficient thickness to cast a shadow onto photosensor 310 that varies as a function of the angle of sun sensor 300 relative to the sun, while aperture 340, which preferably is lithographically defined, transmits sunlight onto photosensor 310.

Patterned mask 330 may reflect some or all of the sunlight that impinges thereon and that is not transmitted through aperture 340, or may absorb some or all of the sunlight that impinges thereon and that is transmitted through aperture 340. It should be appreciated that some materials may be opaque to certain wavelengths of the sunlight, but transparent to other wavelengths of the sunlight. Preferably, patterned mask 330 is opaque at least to wavelengths of sunlight that generate suitable signals at photosensor 310 for use in determining the angle of sun sensor 300.

Patterned mask 330 may include any suitable electrically conductive, electrically semiconductive, or electrically insulative material or combination of materials that is opaque. Examples of conductive materials suitable for use in patterned mask 330 may include, for example, metals such as copper and aluminum. Examples of semiconductive materials suitable for use in patterned mask 330 may include, for example, monocrystalline or amorphous silicon, germanium, gallium arsenide (GaAs), gallium phosphide (GaP), silicon carbide (SiC), indium phosphide (InP), and the like. In one nonlimiting example, patterned mask 330 includes conductive copper. In another nonlimiting example, patterned mask 330 includes aluminum. Note that in embodiments in which patterned mask 330 includes a conductive material such as a metal, the patterned mask also may be used to perform an electrical function within the device, e.g., may be used as a conductive pathway between electrical components of the device. For example, as described in greater detail below with reference to FIGS. 6A-7B, the patterned mask may be used to form interconnects, wiring, or bond pads to provide electrical connections between photosensor 310 and external circuitry. Preferably, in such embodiments, spacer material 320 and overlayer 370 include electrically insulative materials so as to inhibit electrical shorting of signals being transmitted via patterned mask 330.

Optional overlayer 370 is disposed over patterned mask 330 and may be used to package sun sensor 300 in such a manner as to protect patterned mask 330, spacer material 320, photodiode 310, and substrate 301 from the environment in which sun sensor 300 is to be used. For example, overlayer 370 may inhibit oxidation or degradation of patterned mask 330. Preferably, overlayer 370 is at least partially transparent such that at least some sunlight that passes through aperture 340 falls on photosensor 310 with sufficient intensity that the angle of sun sensor 300 may be determined accurately. Overlayer 370 may include a plurality of layers, which may have the same or different compositions as one another. Overlayer 370 may include any suitable electrically conductive, electrically semiconductive, or electrically insulative material or combination of materials that is at least partially transparent to sunlight. It should be appreciated that some materials may be transparent to certain wavelengths of the sunlight, but opaque to other wavelengths of the sunlight. Preferably, overlayer 370 is at least partially transparent to wavelengths of sunlight that generate suitable signals at photosensor 310 for use in determining the angle of sun sensor 300. In one illustrative embodiment, overlayer 370 is transparent in the range of about 400 nm to about 1100 nm. Optionally, overlayer 370 includes a lens (not illustrated) that enhances transmission of sunlight through aperture 340, e.g., by increasing the effective acceptance angle of aperture 340.

Examples of transparent conductive materials suitable for use in overlayer 370 may include, for example, conductive polymers and transparent conductors such as tin oxide ($SnO_2$), indium tin oxide (ITO), zinc oxide (ZnO), and the like. Examples of transparent insulative materials suitable for use in overlayer 370 may include, for example, inorganic oxides such as silicon oxide ($SiO_x$, e.g., $SiO_2$) or aluminum oxide ($Al_2O_3$), silicon nitride ($Si_3N_4$), and insulative polymers. Additionally, non-transparent materials may be disposed above, below, or within overlayer 370, but preferably are not disposed in regions that lie over photosensor 310 so as to reduce the risk that such non-transparent materials may cast a shadow onto photosensor 310 when sun sensor 300 is exposed to sunlight.

Note that in sun sensor 300, the physical thickness T of spacer material 320 defines the physical distance between photosensor 310 and patterned mask 330, and that preferably there is substantially no free space disposed between the photosensor and the patterned mask. As such, the refractive index of the material or combination of materials of spacer material 320 may cause the effective distance between spacer material 320 and patterned mask 330 to differ from what it would be in free space. The thickness T of spacer material 320, width W of aperture 340, and dimension 2L of photosensor 310 suitably may be co-selected so as to provide sun sensor 300 with desired performance characteristics. For example, thickness T may be in the range of about 1 nm to about 10 microns, or about 5 nm to about 5 microns, or about 1 micron to about 5 microns, or about 1 micron to about 3 microns, or about 10 nm to about 1 micron, or about 50 nm to about 500 nm. Or, for example, aperture width W may be in the range of about 5 nm to about 5 microns, e.g., about 10 nm to about 1 micron, e.g., about 50 nm to about 500 nm. Or, for example, photosensor dimension 2L may be in the range of about 5 nm to about 5 microns, e.g., about 10 nm to about 1 micron, e.g., about 50 nm to about 500 nm. As should be appreciated, thickness T suitably may be defined using materials deposition techniques, while aperture width W and photosensor dimension 2L suitably may be defined using materials patterning techniques, such as lithography (e.g., photolithography or particle beam lithography).

Because monolithic sun sensor 300 suitably may be prepared using materials processing techniques, rather than mechanical assembly of discrete components, a plurality of such sun sensors may be prepared concurrently with one another using batch processing. That is, a plurality of sun sensors instead may be formed using a common sequence of processing steps, rather than providing each sun sensor individually through such a sequence of steps. FIG. 3B illustrates a plan view of an assembly 300' which includes a plurality of sun sensors 300, each of which may have a construction analogous to that described above with reference to FIG. 3A. The sun sensors 300 of assembly 300' are disposed on a common substrate 301 (not visible in FIG. 3B). Specifically, a plurality of photosensors 310 are disposed on or embedded within common substrate 301. As represented by the vertical and horizontal lines that divide photosensors 310 into quadrants, the photosensors in the illustrated embodiment include four photodetectors 311, providing sun sensors 300 with biaxial functionality. Although not illustrated in FIG. 3B, a common layer of spacer material 320 is disposed over the plurality of photosensors 310 in a manner analogous to that illustrated in FIG. 3A. As may be seen in FIG. 3B, a common patterned mask 330 is disposed over spacer material 320 and defines a plurality of apertures 340 that are respectively positioned over the plurality of photosensors 310. Optionally, a common overlayer 370 (not illustrated in FIG. 3B, but analogous to that illustrated in FIG. 3A) may be disposed over the common patterned mask 330.

Substrate 301 may be of any suitable size for use in materials processing techniques, and any suitable number of individual sun sensors 300 may be defined thereon using such materials processing techniques. Following such processing, substrate 301 may be diced so as to form a plurality of discrete monolithic sun sensors 300, e.g., may be diced along vertical line 380 and horizontal line 390 so as to divide assembly 300' into four discrete sun sensors that may be used individually to measure the angle of an object relative to the sun. Note, however, that sun sensors 300 need not necessarily be discrete from one another to be used. That is, common substrate 301 need not necessarily be diced in such a manner as to cause each and every sun sensor 300 to be discrete from all of the other sun sensors, but instead some sun sensors may remain physically coupled to one another via substrate 301, e.g., in groups of two, four, eight, ten, or more sun sensors.

Additionally, note that in assembly 300', each of spacer material 320, patterned mask 330, and overlayer 370 need not necessarily extend over the entire surface of substrate 301, but instead may be individually patterned to form discrete regions of the materials associated with a given sun sensor 300 or group of such sun sensors, e.g., as described further below with reference to FIGS. 6A-7B. However, even if assembly 300' includes different discrete regions of spacer material 320, patterned mask 330, or overlayer 370, such regions still may be formed using common processing steps on a common substrate, thus providing the benefits of batch processing and obviating the need to individually prepare sun sensors 300.

Although not illustrated in FIGS. 3A-3B, it should be appreciated that following their preparation, sun sensors 300 and assembly 300' thereof may be electrically coupled to suitable circuitry configured to measure the angle of the sun sensor relative to the sun based on the shadow cast by patterned mask 330 onto photosensor 310. Such circuitry may include a power source configured to apply a bias to photosensor 310, circuitry configured to receive one or more signals from photosensor 310, and circuitry configured to calculate the angle of sun sensor 300 relative to the sun based on the received signals. Such circuitry is known to those skilled in the art of sun sensors, and suitably may be adapted for use with the present monolithic sun sensors. Indeed, as described in further detail herein, such circuitry may be prepared on a common substrate with one or more sun sensors 300 using common processing steps, thus further enhancing efficiency and lowering the cost of producing finished sun sensors.

Additionally, note that because sun sensors 300 of assembly 300' may be formed concurrently with one another, using well known materials processing techniques, the various components of the sun sensors may have materials, dimensions, and alignments relative to one another that are highly reproducible both within a given batch, as well as between different batches. As such, each sun sensor 300 need not necessarily be calibrated individually. Instead, only a single such sun sensor 300 may be calibrated, e.g., by rotating sun sensor 300 through known angles and by correlating signal(s) received from photosensor 310 with those angles. The calibration of such sun sensor 300 then may be applied to other sun sensors formed in the same batch as that sun sensor, as well as other sun sensors formed in other batches using analogous processing to that sun sensor, for example by suitably adjusting the previously-mentioned circuitry to which the sun sensors may be coupled. In an alternative embodiment, sun sensors 300 of assembly 300' may be used without any calibration.

As mentioned above, the use of a square or rectangular aperture may facilitate simplified measurement of the angle of sun sensor 300 based on the output of photosensor 310. For example, for a sun sensor that includes a photosensor 310 with four square photodetectors 311 each of side length L and a square aperture of side length W=L with sides parallel to the sides of the photodetectors and whose center is directly above the intersection of the four photodetectors, and a separation T between the photodetectors and the aperture, the solar incidence angles in the x and z directions may be calculated as:

$$\alpha_{x1} = \tan^{-1}\left\{\frac{L}{2T}\left(\frac{I_D + I_C - I_A - I_B}{I_A + I_B + I_C + I_D}\right)\right\} \quad (1)$$

$$\alpha_{z1} = \tan^{-1}\left\{\frac{L}{2T}\left(\frac{I_C + I_B - I_A - I_D}{I_A + I_B + I_C + I_D}\right)\right\} \quad (2)$$

Where $\alpha_{x1}$ is the angle through the x-axis from the +y direction, and $\alpha_{z1}$ is the angle through the z-axis from the +y directions. Equations (1) and (2) assume that the sun sensor is mounted on the +y face of an object in a particular orientation, and may be suitably modified if the sun sensor is mounted on a different face of the object. Referring to the labeling of photodetectors 311 illustrated in FIG. 3B, $I_A$ is the current generated by photodetector A, $I_B$ is the current generated by photodetector B, $I_C$ is the current generated by photodetector C, and $I_D$ is the current generated by photodetector D. Equations (1) and (2) are exact at small incidence angles where the refractive index of the material(s) disposed between the photodetectors and the aperture does not significantly change the free-space light path. Equations (1) and (2) may be suitably modified to account for greater incidence angles or the refractive indices of the material(s) disposed between the photodetectors and the aperture.

Methods of forming monolithic sun sensors and assemblies thereof now will be described with reference to FIGS. 4A-4B. FIG. 5 illustrates a cross-sectional view of a sequence of material layers that may be formed during preparation of exemplary monolithic sun sensors and assemblies thereof, e.g., material layers that may be formed using steps set forth in FIGS. 4A-4B, but omitting the illustration of patterning of such layers.

Figure 4A:
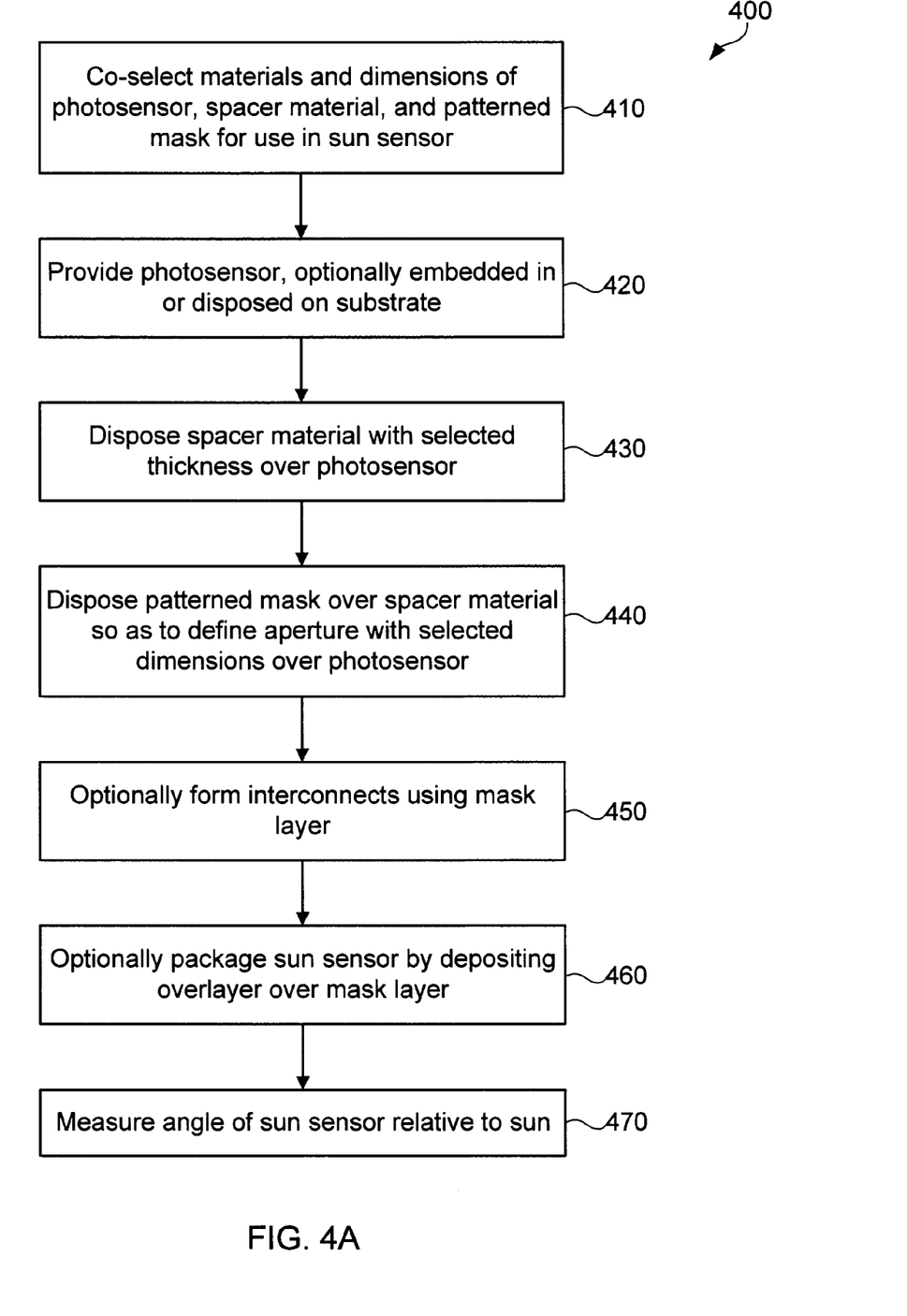
FIG. 4A illustrates steps in an exemplary method for preparing and using a monolithic sun sensor, according to one embodiment of the present invention.
Figure 5:
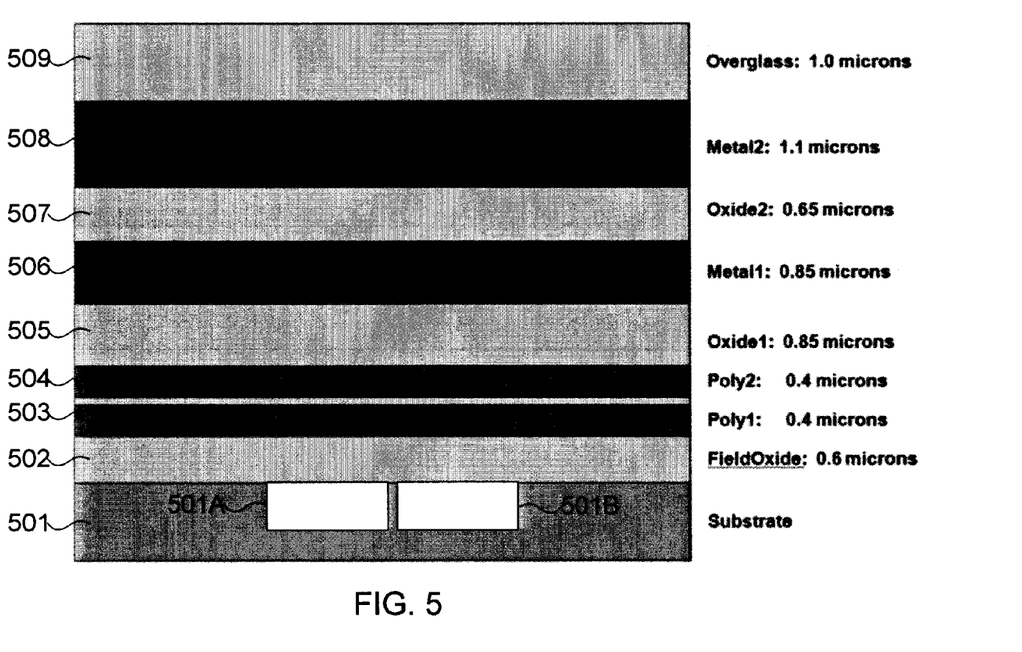
FIG. 5 schematically illustrates a cross-sectional view of a sequence of material layers that may be formed during preparation of an exemplary monolithic sun sensor, according to one embodiment or the present invention.

Specifically, FIG. 4A illustrates steps in an exemplary method 400 for preparing sun sensor 300 illustrated in FIG. 3A. Method 400 includes co-selecting the materials and dimensions of a photosensor, spacer material, and patterned mask 330 for use in a sun sensor (step 410). Exemplary materials, relative dimensions, and absolute dimensions of such components are described in greater detail above with reference to FIG. 3A.

Method 400 further includes providing the photosensor, optionally embedded in or disposed on a substrate (step 420). For example, substrate 501 illustrated in FIG. 5 may include high-purity, monocrystalline silicon, in which selected regions are doped with suitable dopants such as boron, arsenic, phosphorous, or gallium so as to define a p-n or p-i-n junction. For example, as illustrated in FIG. 5, regions 501A and 501B of substrate 501 may be oppositely doped so as to define a p-n junction. One exemplary method for doping a substrate such as silicon includes photolithographically masking the substrate in regions other than where the dopant is desired; exposing the substrate to a gas containing the dopant, which causes exposed regions of the substrate to become doped; and then removing the mask. Another exemplary method for doping a substrate such as silicon includes exposing the substrate to a patterned beam of ions of the desired dopant. A field oxide layer 502 ("FieldOxide") of suitable thickness for electrically insulating doped regions 501A and 501B then may be formed over substrate 501, e.g., by exposing substrate 501 to heat, water vapor, oxygen, a PVD or CVD process, or any suitable combination thereof. In one illustrative embodiment, field oxide 502 is formed by exposing substrate 501 to steam and heat, which oxidize the upper surface of the substrate to form silicon oxide (SiO$_x$). Note that field oxide layer 502 optionally may be omitted, and that first oxide layer 505 may provide analogous functionality as field oxide layer 502.

In the embodiment illustrated in FIG. 5, providing the photosensor further includes first and second layers 503, 504 of polycrystalline silicon ("Poly1" and "Poly2"), may be deposited over field oxide layer 502 and patterned so as to form conductive contacts to doped regions 501A and 501B (patterning not illustrated). Exemplary methods of forming polycrystalline silicon include vapor deposition processes such as low-pressure chemical vapor deposition (LPCVD), plasma-enhanced chemical vapor deposition (PE-CVD), solid-phase crystallization (SPC), and deposition of amorphous silicon (a-Si) using such techniques followed by laser- or metal-induced crystallization of the a-Si. Preferably, polycrystalline silicon layers 503, 504 are patterned such that they do not overlie doped regions 501A and 501B. Examples of suitable patterning are described in greater detail below with reference to FIGS. 6A-7B.

Referring again to FIG. 4A, method 400 further includes disposing a spacer material with a selected thickness over the photosensor (step 430). The spacer material may include a single material that is at least partially transparent to sunlight, or may include a plurality of materials that are at least partially transparent to sunlight. For example, in the embodiment illustrated in FIG. 5, field oxide layer 502 constitutes a first portion of the spacer material, a first oxide layer 505 ("Oxide1") constitutes a second portion of the spacer material, and a second oxide layer 507 ("Oxide2") constitutes a third portion of the spacer material. That is, layers 502, 505, and 507 together provide a functionality analogous to that of spacer material 320 illustrated in FIG. 3A, even though the layers may be deposited during different process steps than one another, may have different compositions than one another, and may have other material layers interposed therebetween. For example, as noted above, layer 502 may be formed by oxidizing the upper surface of substrate 501. Layers 505 and 507 may be formed independently of one another using any suitable materials deposition technique, such as a PVD or CVD-based process, or a liquid-based process. In one example, layers 505 and 507 are both inorganic oxides such as SiO$_x$ formed using a CVD process or a liquid-based spin-on glass (SOG) process. In the embodiment illustrated in FIG. 5, the collective thickness of layers 502, 505 and 507 defines the physical distance between doped regions 501A, 501B of the photosensor, and the second metal layer 508 of the patterned mask (described in greater detail below). Just as layers 502, 505, and 507 may include different materials than one another, these layers further may have different refractive indices than one another.

Additionally, as illustrated in FIG. 5, a first layer of metal 506 ("Metal1") may be deposited and patterned after first oxide layer 505 and before second oxide layer 507 (patterning not illustrated). First metal layer 506 preferably is patterned so as not to overlie doped regions 501A and 501B, but may be used to provide interconnections between electrical components within the sun sensor, e.g., as described in greater detail below with reference to FIGS. 6A-7B. Exemplary methods of depositing and patterning a metal layer is described in greater detail below with reference to step 440 of FIG. 4A. In one illustrative embodiment, first metal layer 506 is a copper or aluminum layer deposited using an electron-beam process and is photolithographically patterned.

Specifically, method 400 illustrated in FIG. 4A further includes disposing a patterned mask over the spacer material so as to define an aperture with selected dimensions over the photosensor (step 440). For example, in the embodiment illustrated in FIG. 5, second layer of metal 508 ("Metal2") is deposited over second oxide layer 507 and subsequently patterned (patterning not illustrated) so as to define an aperture over the photosensor, e.g., over doped regions 501A and 501B. Any suitable method of depositing a metal may be used to deposit second metal layer 508, such as PVD or CVD. Suitable methods for patterning the metal also may be used, such as photolithographically defining a mask over the metal, exposing the masked metal to an etchant to remove non-masked regions of the metal, and then removing the mask. In one illustrative embodiment, second metal layer 508 is a copper or aluminum layer deposited using an electron-beam process and is subsequently photolithographically patterned.

Referring again to FIG. 4A, method 400 includes optionally forming interconnects using the mask layer (step 450). For example, as described in greater detail below with reference to FIGS. 6A-7B, second metal layer 508 may be patterned so as to define not only an aperture that transmits sunlight onto the photosensor, but also to provide electrical interconnections and bond pads for use in obtaining signals from the photosensor that vary as a function of the sun sensor's angle relative to the sun. Because common deposition and patterning processes may be used to concurrently define the aperture, interconnects, and bond pads, the number and complexity of processing steps needed to prepare the sun sensor suitably may be reduced.

Method 400 illustrated in FIG. 4A also includes optionally packaging the sun sensor by depositing an overlayer over the mask layer (step 460). For example, as illustrated in FIG. 5, a glass-based overlayer 509 ("Overglass") may be disposed over second metal layer 508. Overlayer 509 may be formed of any material suitable to protect second metal layer 508, as well as underlying layers, from environmental conditions that otherwise may cause oxidation or other damage to such layers. Overlayer 509 may be formed using methods such as described above with reference to step 430 of FIG. 4A.

FIG. 5 illustrates exemplary thicknesses and materials for each of layers 502-509. Specifically, field oxide layer 502 has an exemplary thickness of 0.6 microns; first and second polycrystalline silicon layers 503, 504 each have an exemplary thickness of 0.4 microns; first oxide layer 505 has an exemplary thickness of 0.85 microns; first metal layer 506 has an exemplary thickness of 0.85 microns; second oxide layer 507 has an exemplary thickness of 0.65 microns; second metal layer 508 has an exemplary thickness of 1.1 microns; and overlayer 509 has an exemplary thickness of 1.0 microns. Together, the optical path (physical thickness) between second metal layer 508 and doped regions 501A, 501B is 2.1 microns. In some embodiments, polycrystalline silicon layers 503, 504 are partially transparent to sunlight, and may be provided over doped regions 501A, 501B so as to increase the optical path (physical thickness) between second metal layer 508 and doped regions 501A, 501B to 2.9 microns. Moreover, polycrystalline silicon has a relatively high refractive index (about 3.6) as compared to silicon dioxide (about 1.26), and so thinner layers of polycrystalline silicon may be used to increase the effective thickness between second metal layer 508 and doped regions 501A, 501B without necessarily proportionally increasing the physical thickness. It should be understood that such thicknesses, materials, and refractive indices are purely illustrative, and that the thicknesses, materials, and refractive indices in a given sun sensor suitably may be varied.

Additionally, as noted above, a plurality of the present sun sensors suitably may be prepared concurrently with one another using batch processing. FIG. 4B illustrates steps in an exemplary method 400' for preparing and dicing an assembly of sun sensors to form a plurality of discrete sun sensors, as well as using the sun sensors.

Figure 4B:
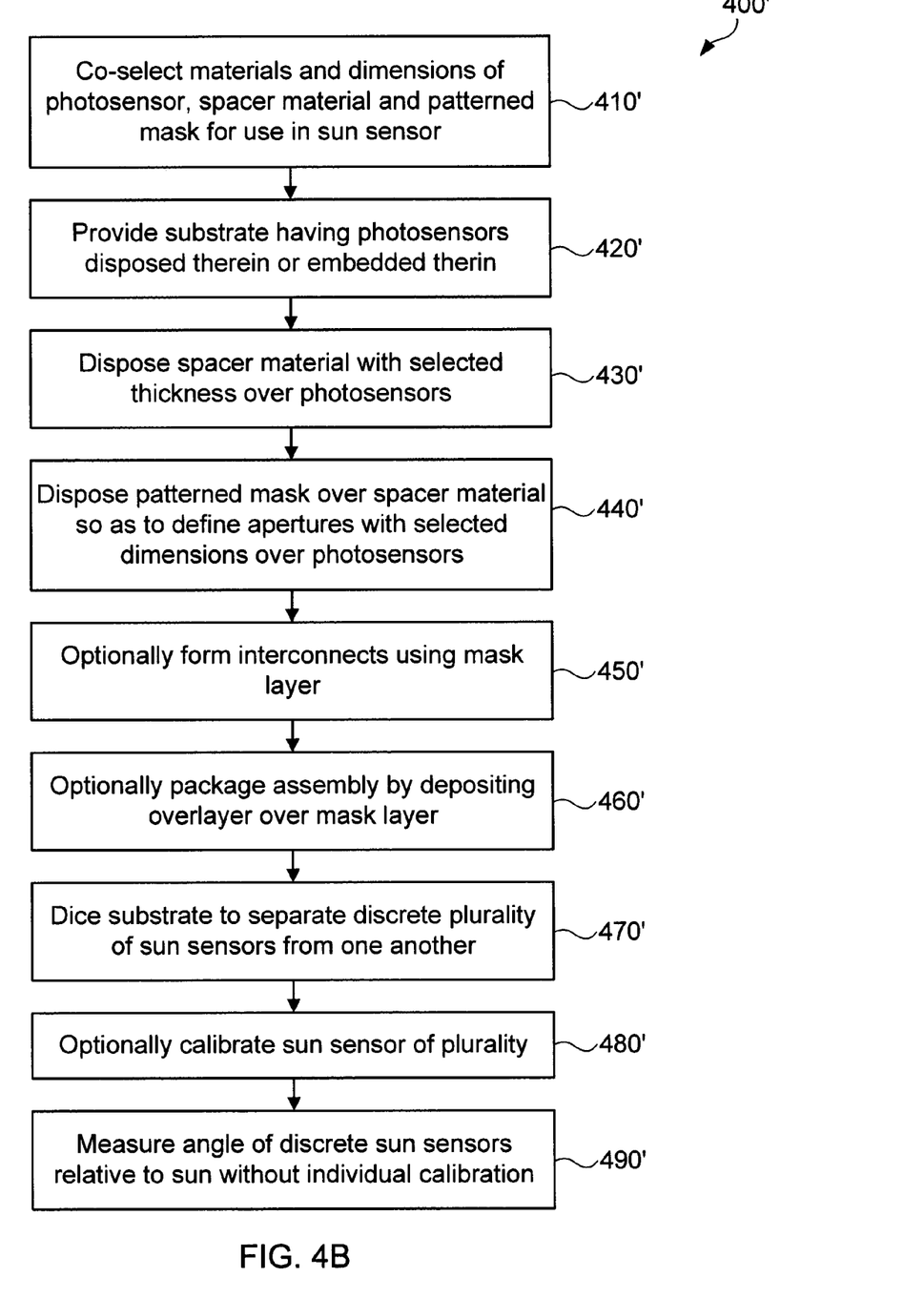
FIG. 4B illustrates steps in an exemplary method for preparing and using an assembly of monolithic sun sensors, according to one embodiment of the present invention.

Specifically, steps 410'-460' of exemplary method 400' illustrated in FIG. 4B may be used to prepare an assembly 300' of sun sensors such as illustrated in FIG. 3B. Method 400' includes co-selecting the materials and dimensions of a photosensor, spacer material, and patterned mask 330 for use in a sun sensor (step 410'), in a manner analogous to that described above with reference to step 410 of FIG. 4A.

Method 400' further includes providing a substrate having a plurality of photosensors embedded in or disposed thereon (step 420'). Methods of providing photosensors in or on a substrate are described in greater detail above with reference to step 420 of FIG. 4A. Such methods readily may be adapted to provide a plurality of photosensors on a common substrate, e.g., on substrate 301 illustrated in FIGS. 3A-3B or on substrate 501 illustrated in FIG. 5.

Method 400' further includes disposing a spacer material with a selected thickness over the plurality of photosensors (step 430'), e.g., in a manner analogous to that described above with reference to step 430 of FIG. 4A. Because the photosensors are disposed on a common substrate, the spacer material or materials readily may be disposed over all of the photosensors in a common processing step or steps.

Method 400' illustrated in FIG. 4B further includes disposing a patterned mask over the spacer material so as to define an aperture with selected dimensions over the photosensor (step 440'). Methods of providing patterned masks are described in greater detail above with reference to step 440 of FIG. 4A. Optionally, interconnects may be formed using the mask layer (step 450') in a manner analogous to that described above with reference to step 450 of FIG. 4A.

Method 400' illustrated in FIG. 4B also includes optionally packaging the sun sensor by depositing an overlayer over the mask layer (step 460') in a manner analogous to step 460 described further above with reference to FIG. 4A. Alternatively, packaging step 460' may be performed following dicing step 470' described below.

As mentioned above, exemplary steps 410'-460' illustrated in FIG. 4B may be used to prepare an assembly of sun sensors 300' such as illustrated in FIG. 3B. Method 400' further includes dicing the substrate so as to separate discrete sun sensors of the plurality from one another (step 470'). Methods of dicing a substrate are well known in the art. Note that during such dicing, not all sun sensors need be separated from one another; instead, any desired number of sun sensors may be left together on a common portion of the substrate. Indeed, if a suitable number of sun sensors are left together on a common portion of the substrate and used in parallel with one another, the outputs of such a collection of sun sensors may be averaged together so as to average out relative variations in their construction, thus improving the accuracy of the measurement. If it is desired to use the entire assembly in such a manner, the dicing step may be omitted. The discrete sun sensors optionally may be provided with an overlayer (step 460)', as well as further packaged and connected to suitable circuitry, which optionally may be provided on a common substrate as the sun sensors (not illustrated). Such further packaging may include encasing the sun sensors or circuitry in a polymer, glass, or other material, which preferably is transparent. One of the sun sensors thus formed optionally may be calibrated (step 480'), and the angles of the discrete sun sensors relative to the sun may be measured without the need to individually calibrate each of the sun sensors.

In one exemplary embodiment, an assembly of sun sensors as packaged for use, including supporting circuitry and packaging, may include tens, hundreds, thousands, tens of thousands, or even hundreds of thousands or more individual sun sensors that share a common substrate. The packaged assembly may have lateral dimensions of about 10 mm on a side or less, or about 5 mm on a side or less, or about 2 mm on a side or less, or about 1 mm on a side or less, or about 500 microns on a side or less, or even about 100 microns on a side or less. The thickness of such an assembly may be about 10 mm or less, or about 5 mm or less, or about 2 mm or less, or about 1 mm or less, or even about 0.5 mm or less, e.g., about 0.3 mm. Additionally, the power requirements of such an assembly may be relatively low as compared to previously known, individually mechanically constructed sun sensors, which may require powers of a few hundred milliwatts. For example, an assembly of the present sun sensors, including supporting circuitry, may have a power requirement of less than about 100 milliwatts, or less than about 10 milliwatts, or less than about 5 milliwatts, or less than about 2 milliwatts, or less than about 1 milliwatts, or even less than about 0.5 milliwatts.

Accordingly, it may be seen that methods such as illustrated in FIGS. 4A-4B facilitate the preparation and use of compact, highly reproducible sun sensors with significantly reduced complexity of fabrication and calibration relative to previously known manually constructed sun sensors. Additionally, it should be appreciated that such methods are compatible with preparing additional devices on the same substrate as the sensors either concurrently, before, or after the sun sensors are prepared. For example, as mentioned above and as is familiar to those skilled in the art, supporting circuitry for sun sensors may include a power supply for the photosensor, circuitry configured to receive one or more signals from the photosensor, and circuitry configured to determine the angle of the sun sensor based on the received signal(s). The present methods suitably may be adapted to incorporate some or all of such supporting circuitry, such as an analog-to-digital converter or a microcontroller, onto the same substrate as the sun sensors themselves, thus further reducing complexity of preparing and using the devices. Other devices similarly may be provided on the substrate.

Exemplary designs for biaxial and uniaxial sun sensors based on a silicon substrate now will be described with reference to FIGS. 6A-7B.

Figure 6A:
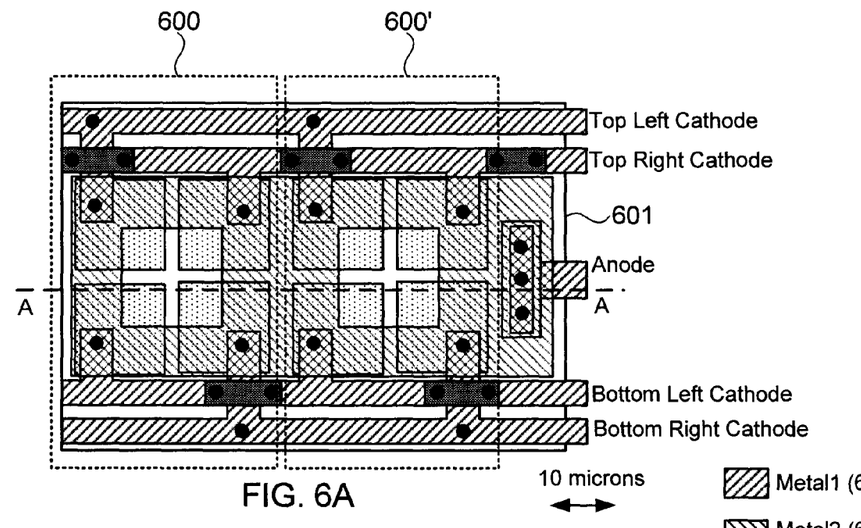
FIGS. 6A-6B schematically illustrate plan and cross-sectional views of a two-axis monolithic sun sensor, according to one embodiment of the present invention.
Figure 6B:
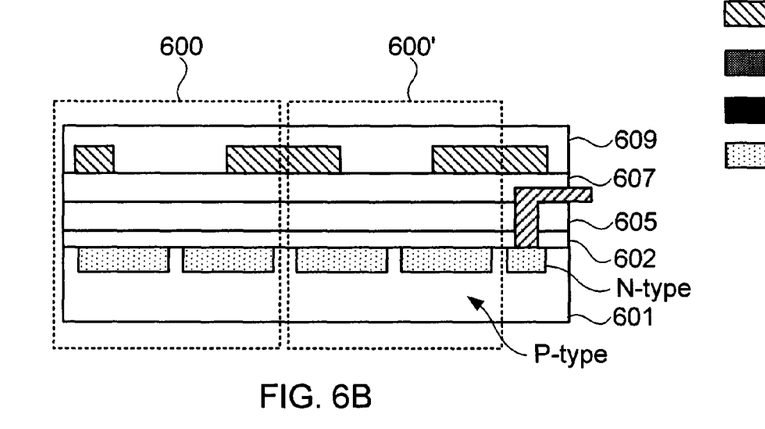

Specifically, FIG. 6A illustrates a plan view of a pair of exemplary biaxial sun sensors 600, 600' disposed on a common substrate 601 as one another, while FIG. 6B illustrates a cross-section of the sun sensors along line A-A illustrated in FIG. 6A. An exemplary 10 micron scale is illustrated in FIGS. 6A-6B, although it should be appreciated that sun sensors 600, 600' may be provided in any suitable scale.

Sun sensors 600, 600' may be formed using the process flows described further above with reference to FIGS. 4A-4B and 5. For example, regions 601A of silicon substrate 601 may be doped to define active photosensor regions. As illustrated in FIG. 6B, the right-most doped region 601A may be doped with an N-type dopant so as to function as a common n-well (anode) for both of sun sensors 600, 600', while the other doped regions 601A may be doped with a P-type dopant so as to function as cathodes for four respective photodiodes within each of the photosensors. The anode may be coupled via vertical contacts (not labeled) to a first patterned portion of a first metal layer 606, ("Metal1"); the top left cathodes may be coupled via vertical contacts to a second patterned portion of that metal layer; the top right cathodes may be coupled via vertical contacts to a third patterned portion of that metal layer; the bottom left cathodes may be coupled via vertical contacts to a fourth patterned portion of that metal layer; and the bottom right cathodes may be coupled via vertical contacts to a fifth patterned portion of that metal layer. As illustrated in FIG. 6A, portions of first metal layer 606 may be coupled to one another using polycrystalline silicon layer 603 and vertical contacts so as to inhibit electrical shorting in regions where the metal layer 606 otherwise may cause electrical contact between the cathode lines. Note that the vertical contacts illustrated in FIGS. 6A-6B may be formed using portions of the first metal layer 606 as illustrated in FIG. 6B, or using portions of the first or second polycrystalline silicon layers 603, 604 (layer 604 not shown in FIGS. 6A-6B), or alternatively may be formed using a separate process or material such as known in the art. As best seen in FIG. 6A, second metal layer 608 ("Metal2", shown in partial transparency to permit viewing of underlying structures) is disposed over the doped regions 601A that define the photosensor cathodes of sun sensors 600, 600', and has apertures defined therein that permit sunlight to pass through onto portions of the cathodes as a function of the sun sensor's angle.

As best seen in FIG. 6B, sun sensors 600, 600' not only share common substrate 601, but also share field oxide layer 602 disposed over doped regions 601A; first oxide layer 605 disposed over field oxide layer 602; first metal layer 606 disposed over first oxide layer 605; second oxide layer 607 disposed over first oxide layer 605 and first metal layer 606; second metal layer 608 disposed over second oxide layer 607; and overlayer 609 disposed over second metal layer 608 and second oxide layer 607. Together, field oxide layer 602 and first and second oxide layers 605, 607 together define a physical distance between doped regions 601A, which define photosensors, and second metal layer 608, which defines apertures. Although layers 602-609 are illustrated in FIG. 6B as being planar, note that planarization between material deposition steps is optional, and need not be performed. Additionally, sun sensors 600, 600' may share a common anode, thus reducing the number of separate components that otherwise may need to be fabricated.

In the non-limiting example illustrated in FIGS. 6A-6B, each aperture defined by second metal layer 608 is about 11 microns on a side, and each sun sensor 600, 600' is about 34 microns on a side and about 50 to 1000 microns thick, depending on the substrate thickness. Over 500 of such interconnected sun sensors may fit on a 1 millimeter square die, and may intercept about 0.06 square mm of sunlight at normal incidence. The total output current at 0.2 A/W may be about 12 microamperes under normal-incidence terrestrial sunlight (about 1 kw/m$^2$). In comparison, as noted above, previously known individual sun sensors may have widths of more than 1 cm per side. Under the principles described herein, significant decreases in overall cell size are provided by using a relatively low number of metal processes to allow stacking of cathode bus lines, and by using CMOS processes with relatively small minimum feature size.

Figure 7A:
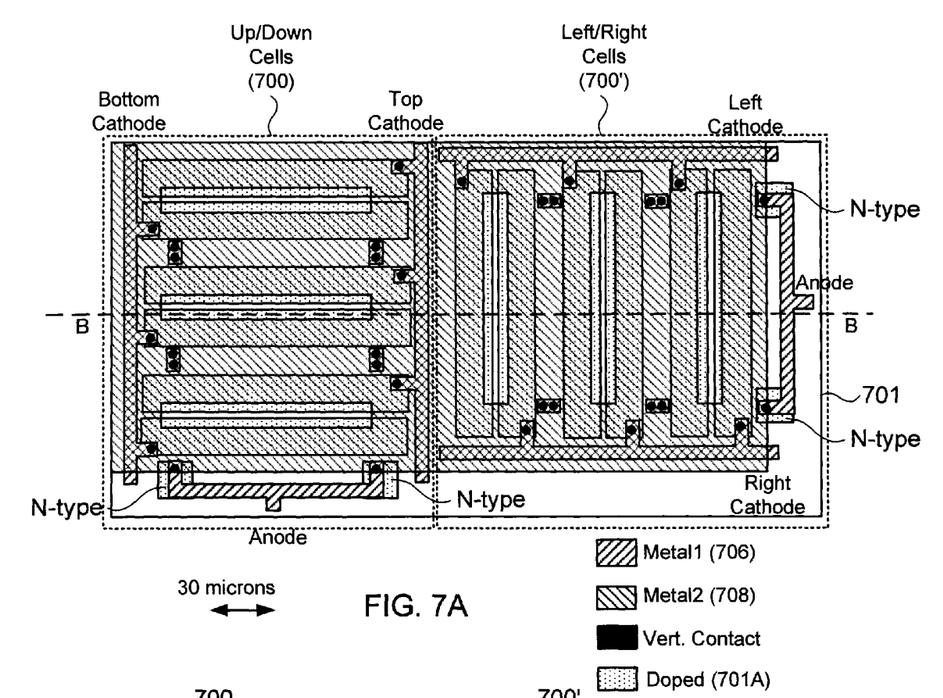
FIGS. 7A-7B schematically illustrate plan and cross-sectional views of a pair of one-axis monolithic sun sensors, according to one embodiment of the present invention.
Figure 7B:
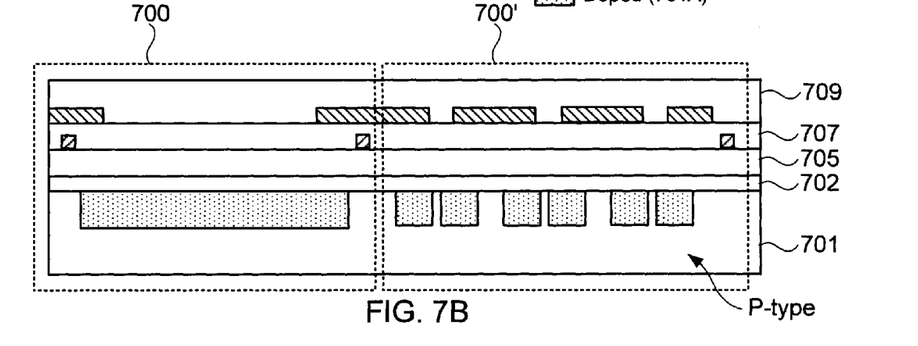

Note that in FIGS. 6A-6B, sun sensors 600, 600' are both biaxial, which may provide redundant functionality in the eventuality that one of the sun sensors is damaged, and also may average out variations in the construction of the sun sensors. Alternatively, a pair of uniaxial sun sensors that are rotated by 90 degrees relative to one another may perform a similar functionality as a biaxial sun sensor, and multiple of such pairs may be provided to achieve analogous redundant functionality and variation averaging. For example, FIG. 7A illustrates a plan view of a plurality of exemplary uniaxial sun sensors disposed on a common substrate 701 as one another, while FIG. 7B illustrates a cross-section of the sun sensors along line B-B illustrated in FIG. 7A. Specifically, FIGS. 7A-7B illustrate a plurality of sun sensors configured to measure orientation in the up/down direction 700 ("Up/Down Cells"), and a plurality of sun sensors configured to measure orientation in the left/right direction 700' ("Left/Right Cells"). Sun sensors 700 are oriented orthogonally relative to sun sensors 700', although it should be appreciated that sun sensors may be provided in any desired orientation relative to one another on a substrate, including non-orthogonal orientations. An exemplary 10 micron scale is illustrated in FIGS. 7A-7B, although it should be appreciated that sun sensors 700, 700' may be provided in any suitable scale.

Sun sensors 700, 700' may be formed using the process flows described further above with reference to FIGS. 4A-4B and 5. For example, regions 701A of silicon substrate 701 may be doped to define active photosensor regions. The doped regions 701A illustrated in FIG. 7B may be doped with a P-type dopant so as to function as cathodes for four respective photodiodes within each of the photosensors, while the doped regions 701A denoted "N-type" in FIG. 7A may be doped with an N-type dopant so as to function as respective n-wells (anodes) for sun sensors 700, 700', The anodes respectively may be coupled via vertical contacts (not labeled) to patterned portion of a first metal layer 706, ("Metal1"). In up/down cells 700, the bottom cathodes may be coupled via vertical contacts to a second patterned portion of that metal layer, and the top cathodes may be coupled via vertical contacts to a third patterned portion of that metal layer. In left/right cells 700', the left cathodes may be coupled via vertical contacts to a fourth patterned portion of that metal layer, and the right cathodes may be coupled via vertical contacts to a fifth patterned portion of that metal layer. Note that the vertical contacts illustrated in FIGS. 7A-7B may be formed using portions of the first metal layer 706 as illustrated in FIG. 7B, or using portions of the first or second polycrystalline silicon layers 703, 704 (not shown in FIGS. 7A-7B), or alternatively may be formed using a separate process or material such as known in the art.

As best seen in FIG. 7A, second metal layer 708 ("Metal2", shown in partial transparency to permit viewing of underlying structures) is disposed over the doped regions 701A that define the photosensor cathodes of sun sensors 700, 700', and has apertures defined therein that permit sunlight to pass through onto portions of the cathodes as a function of the sun sensor's angle. As best seen in FIG. 7B, sun sensors 700, 700' not only share common substrate 701, but also share field oxide layer 702 disposed over doped regions 701A; first oxide layer 705 disposed over field oxide layer 702; first metal layer 706 disposed over first oxide layer 705; second oxide layer 707 disposed over first oxide layer 705 and first metal layer 706; second metal layer 708 disposed over second oxide layer 707; and overlayer 709 disposed over second metal layer 708 and second oxide layer 707. Together, field oxide layer 702 and first and second oxide layers 705, 707 together define a physical distance between doped regions 701A, which define photosensors, and second metal layer 708, which defines apertures. Although layers 702-709 are illustrated in FIG. 7B as being planar, note that planarization between material deposition steps is optional, and need not be performed. Additionally, the bottom and top cathodes of sun sensors 700 may share a first common anode, while the left and right cathodes of sun sensors 700' may share a second common anode thus reducing the number of separate components that otherwise may need to be fabricated.

In the non-limiting embodiment illustrated in FIGS. 7A-7B, each aperture defined by second metal layer 708 is about 11 microns wide, and relatively long. Each set of three sensors 700 or 700' may cover a total area of 22,600 square microns, and have a total open aperture of 1200 square microns. As such, a 2 mm square die may support about 160 sets of triple elements, e.g., about 80 sets of three up/down cells 700 and about 80 sets of three left/right cells 700'.

In the exemplary arrangements illustrated in FIGS. 6A-7B, individual sun sensors may be connected in parallel with all other similarly-oriented sensors, resulting in four output cathodes and a common anode. The distribution of cathode current between the four cathodes yields the solar incidence angle along the two axes. Current may be converted to voltage using transimpedance amplifiers, shorting to the anode across a known fixed resistance. Voltages may be converted to digital data using an analog-to-digital (A/D) converter, and a microprocessor may handle angle calculation and data output. As noted above, such an A/D converter and microprocessor may be provided on the same substrate as the sun sensors and appropriately coupled to the cathode and anode buses. Alternatively, an external A/D converter may be coupled appropriately to the cathode and anode buses and to an external microprocessor. In one embodiment, an ADS1115 4-channel, 16-bit, programmable gain A/D converter (Texas Instruments, Dallas, Tex.) is coupled to the cathode and anode buses so as to receive signals output by the sun sensors. An 8-bit PIC microcontroller (Microchip Technology Inc., Chandler, Ariz.) is coupled to and receives the serial output of the A/D converter and calculates the sun sensors' angle based on such output. Such external components may have relatively small footprints. For example, the exemplary ADS1115 A/D converter has a footprint of only 2.0×1.5 mm.

Additionally, the use of tens, hundreds, thousands, or more sensors on a single common substrate (also referred to as a die) may facilitate generation of summed photocurrents on the order of 1 microampere or more, or 10 microamperes or more, and also may facilitate averaging of any fabrication misalignments of sensors across the substrate. However, as noted above, the use of well-established materials processing and patterning techniques may facilitate relatively accurate absolute and relative alignment of sun sensor components across the substrate. For example, it is believed that single-axis sensors 700, 700' may be made orthogonal to one another with an accuracy of 0.01 degrees or better. Because all of the sun sensors disposed on a given substrate may have substantially the same physical characteristics as one another, a calibration of only a single sun sensor may be applied to all of the other sun sensors that were fabricated on the same substrate as the calibrated sun sensor.

While various illustrative embodiments of the invention are described above, it will be apparent to one skilled in the art that various changes and modifications may be made therein without departing from the invention. For example, it should be appreciated that any suitable number of sun sensors, including a single sun sensor, may be provided on a common substrate as one another. For example, two or more, or four or more, or six or more, or eight or more, or even ten or more sun sensors may be provided on a common substrate. Or, for example, although the above embodiments are primarily described as being sun sensors, it should be appreciated that such sensors suitably may be used to determine the sensors' angles relative to any light source other than the sun. In one illustrative embodiment, a light emitting diode (LED) is used as a light source, and the sensor output used to determine and control orientation of an object relative to that light source. Such an embodiment may be useful for accurately docking a first object (to which the LED is coupled) to a second object (to which the sensor is coupled). Additionally, although the use of square apertures is primarily described above with reference to monolithic sun sensors, it should be appreciated that square apertures suitably may be used with sun sensors of any type, including mechanically assembled sun sensors analogous to those illustrated in FIGS. 1-2. Conversely, the monolithic sun sensors described herein suitably may be made with rounded apertures. The appended claims are intended to cover all such changes and modifications that fall within the true spirit and scope of the invention.

What is claimed:

1. A monolithic sun sensor, comprising:
   a photosensor;
   a spacer material disposed over the photosensor; and
   a patterned mask disposed over the spacer material and defining an aperture over the photosensor,
   the spacer material having a thickness selected such that the patterned mask casts a shadow onto the photosensor that varies as a function of the monolithic sun sensor's angle relative to the sun.

2. The monolithic sun sensor of claim 1, further comprising a substrate in which the photosensor is embedded or on which the photosensor is disposed.

3. The monolithic sun sensor of claim 1, wherein the spacer material is transparent.

4. The monolithic sun sensor of claim 3, wherein the spacer material comprises a layer of inorganic oxide.

5. The monolithic sun sensor of claim 3, wherein the spacer material comprises a plurality of layers of inorganic oxide.

6. The monolithic sun sensor of claim 1, wherein the patterned mask comprises a conductive material.

7. The monolithic sun sensor of claim 6, wherein the conductive material comprises a metal.

8. The monolithic sun sensor of claim 6, wherein the aperture is lithographically defined.

9. The monolithic sun sensor of claim 1, wherein the aperture is square.

10. The monolithic sun sensor of claim 1, further comprising a transparent overlayer disposed over the patterned mask.

11. The monolithic sun sensor of claim 2, further comprising analog and digital signal conditioning electronics disposed on the substrate.

12. An assembly of monolithic sun sensors, the assembly comprising:
    a substrate;
    a plurality of photosensors disposed on or embedded in the substrate;
    a spacer material disposed over the plurality of photosensors; and
    a patterned mask disposed over the spacer material, the patterned mask defining a plurality of apertures respectively over the plurality of photosensors,
    the spacer material having a thickness selected such that the patterned mask casts a shadow onto the plurality of photosensors that varies as a function of the assembly's angle relative to the sun.

13. A method of using the assembly of monolithic sun sensors of claim 10, the method comprising:
    dicing the substrate so as to form a plurality of discrete monolithic sun sensors; and
    measuring the angle of the plurality of monolithic sun sensors relative to the sun without individually calibrating the sun sensors of the plurality.

\* \* \* \* \*

UNITED STATES PATENT AND TRADEMARK OFFICE
CERTIFICATE OF CORRECTION

PATENT NO. : 9,041,135 B2  
APPLICATION NO. : 13/802062  
DATED : May 26, 2015  
INVENTOR(S) : Siegfried W. Janson It is certified that error appears in the above-identified patent and that said Letters Patent is hereby corrected as shown below:

On the title page, item 54 and in the specification, col. 1, lines 1-2 please delete "MONOLITHIC SUN SENSORS ASSEMBLIES THEREOF" and replace with --MONOLITHIC SUN SENSORS AND ASSEMBLIES THEREOF--.

Signed and Sealed this  
Twenty-seventh Day of October, 2015

Michelle K. Lee  
*Director of the United States Patent and Trademark Office*